(12) United States Patent
Morimura et al.

(10) Patent No.: US 9,640,738 B2
(45) Date of Patent: May 2, 2017

(54) LIGHT-EMITTING DEVICE

(71) Applicant: TOYODA GOSEI CO., LTD., Kiyosu-shi (JP)

(72) Inventors: Yuta Morimura, Kiyosu (JP); Yuhki Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/018,704

(22) Filed: Feb. 8, 2016

(65) Prior Publication Data
US 2016/0254417 A1 Sep. 1, 2016

(30) Foreign Application Priority Data

Feb. 27, 2015 (JP) .................................. 2015-039142

(51) Int. Cl.
*H01L 29/49* (2006.01)
*H01L 33/50* (2010.01)
*H01L 33/56* (2010.01)

(52) U.S. Cl.
CPC .......... *H01L 33/508* (2013.01); *H01L 33/501* (2013.01); *H01L 33/56* (2013.01); *H01L 2933/0091* (2013.01)

(58) Field of Classification Search
CPC .............................. H01L 33/508; H01L 33/501
See application file for complete search history.

(56) References Cited

U.S. PATENT DOCUMENTS

| 8,193,702 | B2* | 6/2012 | Lenk | F21V 3/00 313/498 |
| 8,547,009 | B2* | 10/2013 | Hussell | H01L 33/501 257/98 |
| 9,030,108 | B2* | 5/2015 | Deak, Sr. | H05B 33/0803 257/17 |
| 9,287,469 | B2* | 3/2016 | Chakraborty | H01L 33/501 |
| 2003/0038596 | A1* | 2/2003 | Ho | H01L 33/501 313/512 |
| 2005/0248271 | A1* | 11/2005 | Ng | H01L 33/505 313/512 |

(Continued)

FOREIGN PATENT DOCUMENTS

JP 2009-272634 A 11/2009
WO WO 2004/093203 A2 10/2004

*Primary Examiner* — Michael Shingleton
(74) *Attorney, Agent, or Firm* — McGinn IP Law Group, PLLC

(57) ABSTRACT

A light-emitting device includes a light-emitting element, a sealing material for sealing the light-emitting element, a phosphor particle having an average particle size of not more than 20 nm and dispersed in the sealing material, a dispersed particle dispersed in the sealing material and forming a three-dimensional network structure in the sealing material, and a light-scattering particle dispersed in the sealing material, having an average particle size greater than that of the phosphor particle and that of the dispersed particle, and having a refractive index greater than that of the sealing material. A concentration gradient of the phosphor particle in a height direction is formed such that a concentration thereof increases according as a position thereof decreases. An average position of the phosphor particle is lower than that of the light-scattering particle.

20 Claims, 2 Drawing Sheets

(56) References Cited

U.S. PATENT DOCUMENTS

| | | | |
|---|---|---|---|
| 2008/0093976 A1* | 4/2008 | Beckers | H01L 33/54 313/498 |
| 2009/0152582 A1* | 6/2009 | Chang | H01L 33/507 257/98 |
| 2009/0189510 A1* | 7/2009 | Kanamori | C09D 143/04 313/498 |
| 2009/0272996 A1 | 11/2009 | Chakraborty | |
| 2010/0044640 A1* | 2/2010 | Agrawal | C08G 59/30 252/301.36 |
| 2011/0001151 A1* | 1/2011 | Le Toquin | H01L 33/44 257/98 |
| 2012/0146077 A1* | 6/2012 | Nakatsu | H01L 33/486 257/98 |
| 2013/0189803 A1* | 7/2013 | Nasaani | C09K 11/02 438/27 |
| 2013/0270992 A1* | 10/2013 | Gleitsmann | C09K 11/02 313/483 |
| 2014/0103373 A1* | 4/2014 | Li | F21K 9/56 257/88 |
| 2014/0254131 A1* | 9/2014 | Osinski | B82Y 20/00 362/84 |
| 2015/0014725 A1* | 1/2015 | Hong | C09K 11/7721 257/98 |
| 2015/0221836 A1* | 8/2015 | Kurino | H01L 33/501 257/98 |
| 2016/0225962 A1* | 8/2016 | Manion | H01L 33/504 |
| 2016/0254417 A1* | 9/2016 | Morimura | H01L 33/502 |
| 2016/0260873 A1* | 9/2016 | Yamada | H01L 33/502 |

* cited by examiner

LIGHT-EMITTING DEVICE

The present application is based on Japanese patent application No. 2015-039142 filed on Feb. 27, 2015, the entire contents of which are incorporated herein by reference.

BACKGROUND OF THE INVENTION

1. Field of the Invention

The invention relates to a light-emitting device.

2. Description of the Related Art

A light-emitting device is known in which phosphor particles formed into nanoparticles are dispersed in a sealing material which seals a light-emitting element (see e.g., WO 2004/093203).

The light-emitting device disclosed in WO 2004/093203 operates such that light emitted from the light-emitting element is little scattered by the phosphor particles since the average particle size of the phosphor particles is much smaller than the emission wavelength of the light-emitting element, and most of light emitted travels straight and is directly emitted to the outside of the light-emitting device. Thus, the emission light chromaticity of the light-emitting device is high in the emission angle dependency and the unevenness in chromaticity becomes significant.

Also, a light-emitting device is known in which light-scattering particles as well as phosphor particles formed into nanoparticles are dispersed in the sealing material which seals the light-emitting element (see e.g., JP-A-2009-272634).

The light-emitting device disclosed in JP-A-2009-272634 operates such that light emitted from the light-emitting element can be scattered by the light-scattering particles though light is little scattered by the phosphor particles formed into the nanoparticles. Thereby, it is possible to lower the emission angle dependency of the emission light chromaticity of the light-emitting device.

SUMMARY OF THE INVENTION

It is an object of the invention to provide a light-emitting device that is low in the emission angle dependency of the emission light chromaticity and high in the light conversion efficiency of phosphor.

(1) According to an embodiment of the invention, a light-emitting device comprises:

a light-emitting element;

a sealing material for sealing the light-emitting element;

a phosphor particle having an average particle size of not more than 20 nm and dispersed in the sealing material;

a dispersed particle dispersed in the sealing material and forming a three-dimensional network structure in the sealing material; and a light-scattering particle dispersed in the sealing material, having an average particle size greater than that of the phosphor particle and that of the dispersed particle, and having a refractive index greater than that of the sealing material, wherein a concentration gradient of the phosphor particle in a height direction is formed such that a concentration thereof increases according as a position thereof decreases, and wherein an average position of the phosphor particle is lower than that of the light-scattering particle.

In the above embodiment (1) of the invention, the following modifications and changes can be made.

(i) The phosphor particle comprises a quantum dot phosphor particle.

(ii) The dispersed particle comprises a silica.

(iii) The sealing material comprises an organically modified silicone.

(iv) The average particle size of the dispersed particles is smaller than an emission wavelength of the light-emitting element.

Effects of the Invention

According to an embodiment of the invention, a light-emitting device can be provided that is low in the emission angle dependency of the emission light chromaticity and high in the light conversion efficiency of phosphor.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Configuration of Light-Emitting Device

Figure 1A:
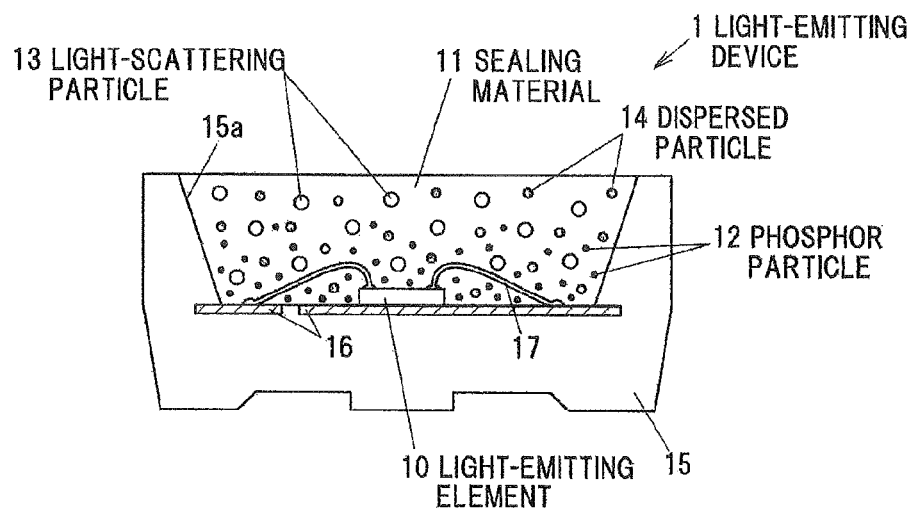
FIG. 1A is a vertical cross sectional view showing a light-emitting device in a first embodiment.

FIG. 1A is a perspective view showing the light-emitting device 1 in the first embodiment. The light-emitting device 1 has a case 15 having a recessed portion 15a, a base 16 housed in the case 15 so that an upper surface is exposed on the bottom of the recessed portion 15a, a light-emitting element 10 mounted on the base 16, a sealing material 11 filled in the recessed portion 15a to seal the light-emitting element 10, and phosphor particles 12, light-scattering particles 13 and dispersed particles 14 which are included in the sealing material 11.

The case 15 is formed of, e.g., a thermoplastic resin such as polyphthalamide resin, LCP (liquid crystal polymer) or PCT (polycyclohexylene dimethylene terephalate), or a thermosetting resin such as silicone resin, modified silicone resin, epoxy resin or modified epoxy resin. The case 15 may include therein light-reflecting particles of titanium dioxide etc. to improve the light reflectance.

The entire base 16 or the surface thereof is formed of a conductive material such as Ag, Cu and Al. The base 16 is e.g. a lead frame integrally formed with the case 15 by insert molding etc.

The light-emitting element 10 is e.g. an LED or a laser diode etc. which has a chip substrate and a crystal layer including cladding layers and an emitting layer sandwiched therebetween. In the example shown in FIG. 1A, the light-emitting element 10 is a face-up type element which is connected to the base 16 via bonding wires 17. However, the light-emitting element 10 may be a face-down type element with the crystal layer facing downward, or may be connected to the base 16 via a member other than bonding wires, e.g. via conductive bumps.

The phosphor particles 12 are very fine particles having an average particle size of not more than 20 nm. Since the particle size of not more than 20 nm is very small relative to the emission wavelength of the light-emitting element 10 and the fluorescence wavelength of the phosphor particles 12 per se, Rayleigh scattering of light emitted from the light-emitting element 10 and other phosphor particles 12 hardly occurs. Thereby, light emitted from the light-emitting element 10 and the phosphor particles 12 is little scattered by other phosphor particles 12 and travels straight.

The phosphor particles 12 are typically particles of phosphor called quantum dot phosphor of which band gap can be adjusted by changing the particle size to control fluorescent color. A material used in this case is, e.g. CdSe, (Cd,Zn)Se or (Cd,Te)Se etc. to produce red fluorescence, and is ZnSe or CdSe, etc., to produce green or blue fluorescence. The phosphor particles 12 are typically e.g. 2 to 10 nm in average particle size.

The light-scattering particle 13 has a larger average particle size than the phosphor particle 12 and a larger refractive index than the sealing material 11, and thus can scatter the light emitted from the light-emitting element 10 and the phosphor particles 12.

When the sealing material 11 is formed of e.g. a silicone resin having a refractive index of about 1.45, the light-scattering particle 13 is formed of a material having a refractive index of more than 1.45, e.g. titanium oxide ($TiO_2$), zinc oxide (ZnO) or alumina ($Al_2O_3$) etc. The light-scattering particles 13 are typically e.g. 100 to 500 nm in average particle size.

Figure 2A:
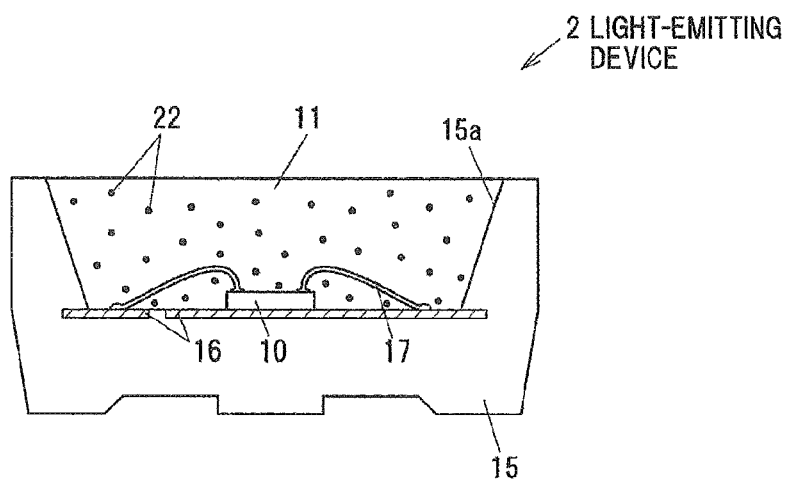
FIG. 2A is a vertical cross sectional view showing a light-emitting device in Comparative Example.

FIG. 2A is a vertical cross sectional view showing a light-emitting device 2 as Comparative Example which does not include light-scattering particles and only includes phosphor particles 22 in the form of nanoparticles (the illustration of the dispersed particles is omitted). Since light emitted is little scattered by the phosphor particles 22 as described above, light radially emitted from the light-emitting element 10 travels straight and is directly emitted from the light-emitting device 2. Thereby, the emission light chromaticity of the light-emitting device 2 becomes high in emission angle dependency.

Figure 2B:
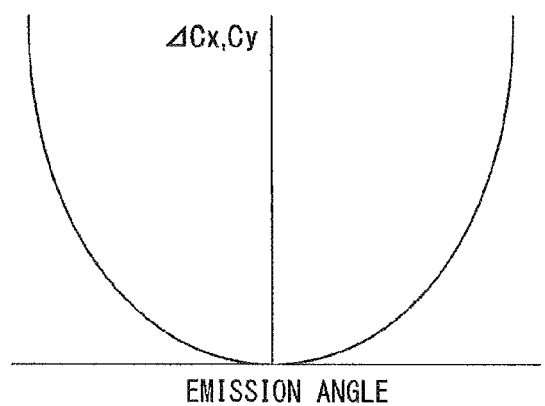
FIG. 2B is a graph schematically showing a relation between the emission angle of light emitted from the light-emitting device in Comparative Example and the chromaticity shift.

FIG. 2B is a graph schematically showing a relation between the emission angle of light emitted from the light-emitting device 2 in Comparative Example and the chromaticity shift. FIG. 2B shows that the greater the emission angle with reference to a vertical direction passing through the center of the light-emitting element 10, the greater the shift $\Delta Cx, Cy$ from the chromaticity at an emission angle of 0°.

On the other hand, in the light-emitting device 1 of the present embodiment, it is possible to scatter light by the light-scattering particles 13 and it is thus possible to lower the emission angle dependency of the emission light chromaticity.

Figure 1B:
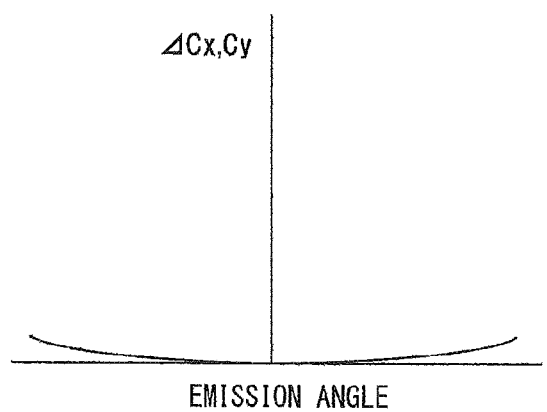
FIG. 1B is a graph schematically showing a relation between the emission angle of light emitted from the light-emitting device 1 and the chromaticity shift.

FIG. 1B is a graph schematically showing a relation between the emission angle of light emitted from the light-emitting device 1 and the chromaticity shift. FIG. 1B shows that variation in the chromaticity shift $\Delta Cx, Cy$ is small even at a large emission angle.

The light scattering intensity of the dispersed particle 14 is larger than that of the light-scattering particle 13. The dispersed particles 14 are typically e.g. 5 to 40 nm in average particle size but is preferably not more than 20 nm with which Rayleigh scattering hardly occurs. The dispersed particles 14 are particles of, e.g. silica ($SiO_2$) such as AEROSIL (trademark).

The dispersed particles 14 form a three-dimensional network structure in the sealing material 11. The meshes of the three-dimensional network structure have such a size that the phosphor particles 12 easily pass through and the light-scattering particles 13 are less likely to pass through. Thus, sedimentation of the light-scattering particles 13 is reduced by the dispersed particles 14 and concentration distribution of the light-scattering particles 13 in the sealing material 11 is highly uniform.

On the other hand, since the phosphor particles 12 pass through the network structure formed of the dispersed particles 14 and settle out, the concentration gradient of the phosphor particles 12 in a height direction is such that the concentration is greater at a lower position. In other words, the concentration of the phosphor particle 12 is greater closer to the bottom of the recessed portion 15a of the case 15.

Thus, the average position of the phosphor particles 12 is lower than that of the light-scattering particles 13 and the concentration of the phosphor particle 12 is relatively large in a region near the light-emitting element 10. In the configuration, a higher percentage of light emitted from the light-emitting element 10 is directly absorbed and efficiently wavelength-converted by the phosphor particles 12 before being scattered by the light-scattering particles 13 than in the configuration in which the phosphor particles 12 are uniformly dispersed in the sealing material 11.

The light wavelength-converted by the phosphor particles 12 in the region near the light-emitting element 10 is scattered by the light-scattering particles 13 which are distributed to the top of the sealing material 11.

The sealing material 11 is formed of a transparent resin such as silicone-based resin or epoxy-based resin. In detail, the sealing material 11 is formed of e.g. a methyl silicone, a phenyl silicone or an organically modified silicone, and is particularly preferably formed of the organically modified silicone.

Since the viscosity of the organically modified silicone is low, the sealing material 11 can be easily controlled in viscosity by adjusting the amount of the dispersed particles 14 added. Thereby, the positioning (speed) of the phosphor particles 12 and the light-scattering particles 13 in the sealing material 11 can be easily controlled.

The form of the sealing material 11 is not limited to that to be filled in a recessed portion as is the recessed portion 15a of the case 15. The sealing material 11 may have e.g. a dome shape covering the light-emitting element 10 mounted on a substrate.

Effects of the Embodiment

In the embodiment, even when using very fine phosphor particles, light is scattered by the light-scattering particles such that the emission angle dependency of the emission light chromaticity of the light-emitting device can be lowered.

In addition, it is possible to control the concentration distribution of the phosphor particles and the light-scattering particles by adjusting the average particle size thereof so as to exhibit different behaviors to the three-dimensional network structure formed by the dispersed particles, thereby improving the wavelength conversion efficiency of the phosphor particles.

Although the embodiment of the invention has been described above, the invention is not intended to be limited to the embodiment and the various kinds of modifications can be implemented without departing from the gist of the invention. In addition, the constituent elements in the embodiment can be arbitrarily combined without departing from the gist of the invention.

In addition, the invention according to claims is not to be limited to the embodiment. Further, please note that all combinations of the features described in the embodiment are not necessary to solve the problem of the invention.

What is claimed is:

1. A light-emitting device, comprising:
   a light-emitting element;
   a sealing material for sealing the light-emitting element;
   a phosphor particle having an average particle size of not more than 20 nm and dispersed in the sealing material;
   a dispersed particle dispersed in the sealing material and forming a three-dimensional network structure in the sealing material; and
   a light-scattering particle dispersed in the sealing material, having an average particle size greater than that of the phosphor particle and that of the dispersed particle, and having a refractive index greater than that of the sealing material,
   wherein a concentration gradient of the phosphor particle in a height direction is formed such that a concentration thereof increases according as a position thereof decreases, particles of the light-scattering article and particles of the dispersed particle being dispersed among particles of the phosphor particle, and
   wherein an average position of the phosphor particle is lower than that of the light-scattering particle.

2. The light-emitting device according to claim 1, wherein the phosphor particle comprises a quantum dot phosphor particle.

3. The light-emitting device according to claim 1, wherein the dispersed particle comprises a silica.

4. The light-emitting device according to claim 1, wherein the sealing material comprises an organically modified silicone.

5. The light-emitting device according to claim 1, wherein the average particle size of the dispersed particles is smaller than an emission wavelength of the light-emitting element.

6. The light-emitting device according to claim 1, further comprising:
   a case that holds the sealing material; and
   a lead frame disposed in the case and electrically connected to the light-emitting element.

7. The light-emitting device according to claim 6, wherein the phosphor particle is disposed on an upper surface of the lead frame.

8. The light-emitting device according to claim 6, wherein the phosphor particle is disposed on an upper surface of the lead frame outside an area of the lead frame on which the light-emitting element is disposed.

9. The light-emitting device according to claim 1, wherein the average particle size of the phosphor particle is in a range from 2 nm to 10 nm.

10. The light-emitting device according to claim 9, wherein the average particle size of the light-scattering particle is in a range from 100 nm to 500 nm.

11. The light-emitting device according to claim 10, wherein the average particle size of the dispersed particle is in a range from 5 nm to 40 nm.

12. The light-emitting device according to claim 1, wherein an amount of the phosphor particle that passes through the three-dimensional network structure of the dispersed particle is more than an amount that the light-scattering particle passes through the three-dimensional network structure.

13. A light-emitting device, comprising:
    a light-emitting element;
    a sealing material for sealing the light-emitting element;
    phosphor particles dispersed in the sealing material;
    dispersed particles dispersed in the sealing material; and
    light-scattering particles dispersed in the sealing material, having an average particle size greater than an average particle size of the phosphor particles and an average particle size of the dispersed particles, and having a refractive index greater than a refractive index of the sealing material,
    wherein a concentration gradient of the phosphor particles decreases, in a height direction of the light-emitting device, from the light-emitting element toward an upper surface of the sealing material, the light-scattering particles and the dispersed particles being dispersed among the phosphor particles.

14. The light-emitting device according to claim 13, wherein, in the height direction of the light-emitting device, an average position of the phosphor particles is lower than an average position of the light-scattering particles.

15. The light-emitting device according to claim 13, wherein the average particle size of the phosphor particles is not more than 20 nm.

16. The light-emitting device according to claim 13, further comprising:
    a case that holds the sealing material; and
    a lead frame disposed in the case and electrically connected to the light-emitting element.

17. The light-emitting device according to claim 16, wherein the phosphor particles are disposed on an upper surface of the lead frame outside an area of the lead frame on which the light-emitting element is disposed.

18. The light-emitting device according to claim 13, wherein the average particle size of the phosphor particles is in a range from 2 nm to 10 nm.

19. The light-emitting device according to claim 18, wherein the average particle size of the light-scattering particles is in a range from 100 nm to 500 nm.

20. The light-emitting device according to claim 19, wherein the average particle size of the dispersed particles is in a range from 5 nm to 40 nm.

* * * * *